(12) United States Patent
Schmehl et al.

(10) Patent No.: US 12,196,986 B2
(45) Date of Patent: Jan. 14, 2025

(54) METHOD FOR PRODUCING A SUBSTRATE FOR AN OPTICAL ELEMENT

(71) Applicant: Carl Zeiss SMT GmbH, Oberkochen (DE)

(72) Inventors: Andreas Schmehl, Noerdlingen (DE); Heiko Siekmann, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 1000 days.

(21) Appl. No.: 17/099,113

(22) Filed: Nov. 16, 2020

(65) Prior Publication Data

US 2021/0072435 A1 Mar. 11, 2021

Related U.S. Application Data

(63) Continuation of application No. PCT/EP2019/061814, filed on May 8, 2019.

(30) Foreign Application Priority Data

May 17, 2018 (DE) ..................... 10 2018 207 759.2

(51) Int. Cl.
*G02B 5/08* (2006.01)
*C30B 11/14* (2006.01)
(Continued)

(52) U.S. Cl.
CPC ............ *G02B 5/0891* (2013.01); *C30B 11/14* (2013.01); *C30B 29/06* (2013.01); *C30B 29/08* (2013.01); *G02B 5/085* (2013.01)

(58) Field of Classification Search
CPC ....... G02B 5/0891; G02B 5/085; C30B 11/14; C30B 29/06; C30B 29/08
See application file for complete search history.

(56) References Cited

U.S. PATENT DOCUMENTS 7,145,739 B1 * 12/2006 Bly ........................ G02B 1/02
359/838
7,843,632 B2 * 11/2010 Bowering .............. G21K 1/062
359/359
(Continued)

FOREIGN PATENT DOCUMENTS

CN 105358742 A 2/2016
DE 19830449 A1 1/2000
(Continued)

OTHER PUBLICATIONS

Taiwan Search Report with English translation, Feb. 3, 2023, 5 pages.
(Continued)

*Primary Examiner* — Bao-Luan Q Le
(74) *Attorney, Agent, or Firm* — Edell, Shapiro & Finnan, LLC

(57) ABSTRACT

A method for producing a substrate (10) for an optical element (11) includes: introducing a starting material, preferably a metal or a semimetal, into a container and melting the starting material, producing a material body having a quasi-monocrystalline volume region (8) by directionally solidifying the molten starting material proceeding from a plurality of monocrystalline seed plates arranged in the region of a base of the container, and producing the substrate by processing the material body to form an optical surface (12). An associated reflective optical element (11), in particular for reflecting EUV radiation (14) includes: a substrate having an optical surface on which a reflective coating (13) is applied. The substrate is typically produced in accordance with the associated method and has a quasi-monocrystalline volume region (8).

8 Claims, 2 Drawing Sheets

(51) Int. Cl.
*C30B 29/06* (2006.01)
*C30B 29/08* (2006.01)

(56) References Cited

U.S. PATENT DOCUMENTS

| | | | | |
|---|---|---|---|---|
| 8,048,221 B2* | 11/2011 | Stoddard | ............... | H01L 31/182 117/73 |
| 8,440,157 B2* | 5/2013 | Stoddard | ............... | C30B 19/067 423/349 |
| 8,591,649 B2* | 11/2013 | Stoddard | ................ | C30B 29/06 117/82 |
| 8,591,851 B2* | 11/2013 | Stoddard | ................ | F27B 14/06 423/348 |
| 8,628,614 B2* | 1/2014 | Stoddard | ........... | H01L 31/02168 117/82 |
| 8,709,154 B2* | 4/2014 | Stoddard | ............... | H01L 31/182 117/82 |
| 8,871,169 B2* | 10/2014 | Stoddard | ................ | C30B 29/06 423/348 |
| 8,951,344 B2* | 2/2015 | Stoddard | ............. | H01L 31/1804 117/921 |
| 9,080,252 B2* | 7/2015 | Lan | ....... | C30B 11/002 |
| 10,125,430 B2* | 11/2018 | Pihan | ....... | B28D 5/04 |
| 10,131,999 B2* | 11/2018 | Fortin | ....... | C30B 11/14 |
| 2001/0028518 A1 | 10/2001 | Kaiser | | |
| 2002/0174825 A1 | 11/2002 | Wehrhan | | |
| 2003/0133209 A1 | 7/2003 | Heine-Kempkens et al. | | |
| 2007/0169684 A1* | 7/2007 | Stoddard | ................ | C30B 28/06 117/13 |
| 2007/0169685 A1* | 7/2007 | Stoddard | ................ | C30B 28/06 257/E27.125 |
| 2009/0047203 A1* | 2/2009 | Mueller | ................ | C30B 11/14 117/83 |
| 2010/0192838 A1* | 8/2010 | Stoddard | ................ | C30B 11/14 117/13 |
| 2010/0193031 A1* | 8/2010 | Stoddard | ................ | C30B 29/06 117/54 |
| 2010/0193989 A1* | 8/2010 | Stoddard | ............. | H01L 31/1804 264/332 |
| 2010/0197070 A1* | 8/2010 | Stoddard | ................ | C30B 11/02 264/308 |
| 2010/0203350 A1* | 8/2010 | Stoddard | ................ | C30B 11/02 117/223 |
| 2011/0129403 A1* | 6/2011 | Stoddard | ............... | C30B 11/003 117/54 |
| 2011/0303143 A1* | 12/2011 | Lan | ......... | C30B 29/06 264/332 |
| 2012/0037066 A1* | 2/2012 | Stoddard | ............. | H01L 31/1804 117/83 |
| 2012/0042947 A1* | 2/2012 | Stoddard | ................ | C30B 29/06 438/57 |
| 2012/0090537 A1* | 4/2012 | Stoddard | ............... | C30B 11/003 117/223 |
| 2013/0213297 A1* | 8/2013 | Stoddard | ................ | C30B 11/02 117/81 |
| 2013/0233239 A1* | 9/2013 | Oriwol | ................... | C30B 29/06 428/64.1 |
| 2014/0048012 A1* | 2/2014 | Stoddard | ................ | F27B 14/06 117/54 |
| 2014/0050649 A1* | 2/2014 | Stoddard | ............. | H01L 31/1804 423/348 |
| 2014/0102359 A1* | 4/2014 | Stoddard | ............. | H01L 31/1804 117/83 |
| 2014/0290740 A1* | 10/2014 | Stoddard | ................ | C30B 11/00 136/258 |
| 2015/0013591 A1* | 1/2015 | Stoddard | ................ | C30B 29/06 117/83 |
| 2015/0087105 A1* | 3/2015 | Stoddard | ............. | H01L 31/1804 65/29.21 |
| 2016/0108548 A1* | 4/2016 | Pihan | ....................... | B28D 5/04 125/12 |
| 2016/0122897 A1* | 5/2016 | Fortin | ..................... | C30B 11/14 125/21 |

FOREIGN PATENT DOCUMENTS

| | | |
|---|---|---|
| DE | 10124423 A1 | 1/2003 |
| DE | 102012203706 A1 | 8/2013 |
| DE | 102012102597 A1 | 9/2013 |
| DE | 102012203524 A1 | 9/2013 |
| DE | 102013107189 A1 | 9/2014 |
| DE | 102018200571 A1 | 7/2019 |
| FR | 2547319 A1 | 12/1984 |
| JP | H107493 A | 1/1998 |
| WO | 2014147262 A1 | 9/2014 |

OTHER PUBLICATIONS

Takenaka, et al., "Evaluation of Mo-Based Multilayer EUV Mirrors", OSA Proceedings on Extreme Ultraviolet Lithography, 1994, vol. 23, 7 pages.
German Office Action with English translation, Application No. 10 2018 207 759.2, Jan. 15, 2019, 4 pages.
International Search Report, PCT/EP2019/061814, Aug. 20, 2019, 2 pages.
German Office Action without English translation, Application No. 102018207759.2, Jan. 15, 2019, 2 pages.
Stoddard et al., "Casting Single Crystal Silicon: Novel Defect Profiles from BP Solar's Mono 2 TM Wafers", ISSN, (2007) 2 pages.
China Office Action with English translation, Application No. 201980033038.X, Feb. 23, 2023, 17 pages.
Chinese Office Action with English translation, Application No. 201980033038.X, Aug. 16, 2023, 12 pages.
European Office Action, Application No. 19725289.3, Oct. 5, 2023, 9 pages.
Chinese Office Action with English translation, Application No. 201980033038.X, Jan. 18, 2024, 13 pages.

* cited by examiner

METHOD FOR PRODUCING A SUBSTRATE FOR AN OPTICAL ELEMENT

CROSS-REFERENCE TO RELATED APPLICATION

This is a Continuation of International Application PCT/EP2019/061814, which has an international filing date of May 8, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 207 759.2 filed on May 17, 2018.

FIELD OF THE INVENTION

The invention relates to a method for producing a substrate for an optical element, in particular for a reflective optical element, and to a reflective optical element comprising a substrate having an optical surface, on which a reflective coating is applied, wherein the substrate is produced in particular utilizing the method.

BACKGROUND

Monocrystalline silicon (m-Si) is often used as substrate material for optical elements, in particular for reflective optical elements in the form of mirrors, which have to have a high thermal conductivity. The mirrors having such a silicon substrate may be, for example, water-cooled synchrotron optical units. The high-quality monocrystalline silicon used for this purpose is produced practically exclusively using the Czochralski method, since the highest crystalline quality is achievable with this method. In the Czochralski method, a cylindrical, monocrystalline crystal (ingot) is pulled from a silicon melt utilizing a monocrystalline seed crystal. The Czochralski method is primarily used for the production of silicon wafers for the semiconductor industry.

The maximum size, in particular the maximum diameter, of the optical elements producible from monocrystalline silicon is determined by the size and the price of the commercially available Czochralski Si ingots. The largest commercially available ingots at the present time originate from 450 mm wafer development. These Si ingots limit the substrate size to cylinders having a diameter of approximately 450 mm with lengths of approximately one meter. It has not been feasible to produce elements composed of monocrystalline silicon that exceed these dimensions up to now. In particular, doing so would require a very expensive and complex new development of larger Czochralski Si ingots and the associated apparatus technology, which would be associated with high costs for the production of such substrates.

This has inspired the development of the so-called vertical gradient freeze (VGF) method, which is a further development of the method for producing poly- or multicrystalline silicon. The VGF method involves arranging a plurality of monocrystalline seed plates on the base of a container filled with a starting material. The starting material is melted and solidifies above the seed plates directionally in the form of a (quasi-)monocrystalline material.

The article "Casting Single Crystal Silicon: Novel Defect Profiles from BP Solar's Mono²™ Wafers", N. Stoddard et al., Solid State Phenomena, Vol. 131-133, pages 1-8, 2008, investigates, inter alia, the types of defect that occur in the production method described further above.

DE 10 2012 102 597 A1 proposes a vertical gradient freeze method in which one of the crystal axes of the seed crystal plates is tilted by a predetermined acute tilt angle relative to a vertical direction and seed crystal plates that are directly adjacent to one another are oriented differently. The seed crystal plates and their edges can be processed in such a way that the latter are placed against one another directly and with minimal tilts and dislocations and completely cover the base of a melting crucible.

DE 10 2012 203 524 A1 describes a method for producing a silicon ingot, wherein at least one flat monocrystalline seed crystal is formed and/or arranged on the base wall of a container in such a way as to avoid twinning in an edge region adjoining the side walls of the container and extending into an interior of the container.

DE 10 2012 203 706 A1 describes a method for producing a silicon ingot, wherein a plurality of seed templates having a crystal structure with a <110> direction are arranged at the base of a container. At least two of the seed templates are arranged in such a way that they have <110> directions that are tilted relative to one another by an angle in the range of 0.2° to 10°. After the seed templates have been arranged in the container, pieces of silicon can be arranged in the container and melted.

SUMMARY

It is an object of the invention to provide a method for producing a substrate for an optical element by which even large-volume substrates can be produced cost-effectively. A further object is to provide a reflective optical element comprising such a substrate.

These and further objects are achieved with a method for producing a substrate for an optical element, comprising: introducing a starting material, preferably a metal or a semimetal, into a container and melting the starting material, producing a material body having a quasi-monocrystalline volume region by directionally solidifying the molten starting material proceeding from one or from a plurality of monocrystalline seed plates, preferably composed of a metal or composed of a semimetal, arranged in the region of a base of the container, and producing the substrate by processing the material body to form an optical surface.

The seed plates used in the method for producing the material body typically consist of a monocrystalline material corresponding to the starting material from which the material body is produced. As a result of directionally solidifying the starting material proceeding from the seed plates, a monocrystalline or quasi-monocrystalline material body or a material body having a quasi-monocrystalline volume region can be produced above the seed plates. The starting material can be for example a metal or a semimetal, in particular germanium or silicon. For purposes of the following discussion, it is assumed that the starting material is silicon.

In the VGF method described here, a large volume region composed of (quasi-) monocrystalline silicon arises above the seed plates. Quasi-monocrystalline silicon differs from monocrystalline silicon in a higher probability of structural defects such as e.g. very small-angle grain boundaries and dislocation clusters. Moreover, on account of the production method, there is a greater probability regarding the occurrence of foreign inclusions. Since the seed plates generally do not reach as far as the lateral edge of the container, an edge or seam of polycrystalline silicon additionally arises around the (quasi-)monocrystalline volume region at the material body. From the (quasi-)monocrystalline volume region of the material body and, if appropriate, partly from the polycrystalline volume region, it is possible to produce one or more substrate(s) for optical elements.

The processing for producing the substrate is typically a mechanical processing, if appropriate supplemented by a non-contact processing of the material body, for example a processing utilizing an ion beam. The mechanical processing of the material body can comprise for example a cutting processing of the material body in order to detach the substrate from the material body. The mechanical processing can also comprise a surface processing, for example grinding or polishing of the optical surface of the substrate. The processing of the optical surface is carried out before a reflective coating is applied thereon, as a result of which a reflective optical element is formed. On account of the production of the substrate from the directionally solidified material body, the material of the substrate of the optical element has the (quasi-) monocrystalline structure described further above at least in the region of the optical surface.

In one variant of the method, the optical surface is formed in the course of processing the material body at one of the seed plates, which is preferably produced using the Czochralski method. In this case, a comparatively large monocrystalline seed plate is mechanically processed in order to form the optical surface. The monocrystalline seed plate is processed for the purpose of forming the optical surface at its side facing away from the (quasi-)monocrystalline volume region of the material body. In this case, the monocrystalline seed plate is used substantially exclusively for the production of the optical surface, while the rest of the substrate, i.e. the (quasi-) monocrystalline volume region, and, if appropriate, the polycrystalline volume region projecting laterally beyond the (quasi-)monocrystalline volume region are fused onto the seed plate in the course of the production of the material body with the method described further above. The substrate thus constitutes a hybrid component composed of Czochralski silicon for the optical surface and (quasi-)monocrystalline silicon and/or polycrystalline silicon for the rest of the substrate, which can extend in particular laterally further outwards than the Czochralski seed plate. The (quasi-)monocrystalline volume region and, if appropriate, the polycrystalline volume region can serve for example for mechanically linking the optical element or the substrate to a holder or to a mount.

In an alternative variant, the optical surface is formed in the course of processing of the material body at the quasi-monocrystalline volume region of the material body. In the case of a substrate for an optical element, the crystalline quality of the silicon in the region of the optical surface is crucial: in the region of the optical surface, it is necessary to ensure a maximum freedom from defects (e.g. no grain boundaries) and also the absence of inclusions and foreign phases (as far as possible no contaminations). In relation to this critical region, the rest of the substrate volume may, if appropriate, decline significantly in qualitative terms.

It has been found that given a suitably chosen process implementation, the achievable surface qualities at the optical surface of the (quasi-)monocrystalline silicon correspond to those of silicon substrates produced using the Czochralski method. The substrate can consist exclusively of the (quasi-) monocrystalline volume region of the material body; that is to say that in this case the polycrystalline volume region of the material body is completely removed during the production of the substrate.

In one variant, the substrate is formed both from a quasi-monocrystalline volume region of the material body and from a polycrystalline volume region of the material body. In this variant, the (integral) substrate also has a polycrystalline volume region. As has been described further above, the quality of the silicon primarily in the vicinity of the optical surface is relevant to the use of the substrate for an optical element. The polycrystalline volume region can be used in particular for mechanical linking of the substrate.

In a further variant, the polycrystalline volume region forms an edge region of the substrate that projects laterally beyond the quasi-monocrystalline volume region at at least one side. As has been described further above, the (quasi-)monocrystalline volume region is surrounded by an edge which extends circumferentially in a ring-shaped manner and which is formed above the partial region of the container at which no seed plates are arranged in the region of the base of the container. For the case where only a single substrate is produced from the material body, the polycrystalline volume region can extend around the (quasi-)monocrystalline volume region in particular in a ring-shaped manner. In this way, the dimensions of the substrate can exceed the dimensions of the (quasi-)monocrystalline volume region, wherein, as has been described further above, the optical surface is positioned in the (quasi-)monocrystalline volume region of the ingot, while the rest of the substrate, specifically the mechanical linkings thereof, can be provided at the polycrystalline volume region.

In a further variant, the polycrystalline volume region extends at least partly below the optical surface formed at the quasi-monocrystalline volume region. In general, that partial volume of the polycrystalline volume region which extends below the optical surface is spaced apart significantly from the optical surface, i.e. it is at a distance from the optical surface of, in general, a plurality of millimeters in order not to impair the quality of the silicon material at the optical surface.

In a further variant, processing the material body comprises separating off a volume region containing the seed plates. For the case where the optical surface is formed at the (quasi-) monocrystalline volume region, it is typically necessary to separate off the volume region containing the seed plates from the volume region used for the production of a substrate over the seed plates. The separating off can be carried out with a cutting mechanical processing, for example.

In a further variant, the method additionally comprises: applying a reflective coating, in particular for reflecting EUV radiation, on the optical surface for producing a reflective optical element. The optical surface of such an optical element on which the reflective coating is applied can have for example a diameter of more than approximately 450 mm. A substrate having such a diameter is not producible in a practical way utilizing the zone melting or Czochralski method. The comparatively cost-effective and industrially established gradient freeze production method with commercially available production machines additionally enables an increased cost efficiency relative to a complex and cost-intensive scaling of the Czochralski method for producing Si ingots.

Instead of a reflective optical element, for example in the form of an EUV mirror, other, for example transmissive, optical components can also be formed from the substrate. In this case, applying a reflective coating on the optical surface can be dispensed with. The substrate of the reflective optical element as described here is embodied in an integral fashion.

A further aspect of the invention relates to a reflective optical element of the type mentioned in the introduction, in particular for reflecting EUV radiation, wherein the substrate, which is produced in particular according to a method as described further above, has a (quasi-) monocrystalline volume region. The (quasi-)monocrystalline volume region or a material body having such a (quasi-)monocrystalline volume region is typically produced with the aid of the method described further above and the substrate of the reflective optical element is formed from the material body utilizing a usually mechanical processing.

In one embodiment, the substrate comprises a monocrystalline volume region, wherein the optical surface is formed from or at the monocrystalline volume region. In this embodiment, a monocrystalline seed plate, produced for example through the Czochralski method, is typically fused into the material body from which the substrate is formed, i.e. the substrate is a hybrid component.

In an alternative embodiment, the optical surface is formed from or at the quasi-monocrystalline volume region. As has been described further above, given a suitable process implementation, the surface quality achievable at the optical surface corresponds to that of monocrystalline silicon such as is produced by the Czochralski method. However, the diameter or the dimensions of the optical surface can be significantly larger than is the case when producing the substrate using the Czochralski method.

In a further variant, the substrate comprises a polycrystalline volume region, which projects laterally beyond the quasi-monocrystalline volume region at least at one side. In this embodiment, the polycrystalline volume region of the material body described further above is also used for the production of the substrate. By way of example, the reflective optical element can be secured to a mount or the like at the polycrystalline volume region protruding e.g. in a ring-shaped manner.

In a further embodiment, the polycrystalline volume region at least partly extends below the optical surface formed from or at the quasi-monocrystalline volume region. As has been described further above, that partial volume of the polycrystalline volume region which extends below the optical surface should be at a sufficient distance from the optical surface in order to prevent the polycrystalline volume region from having a negative influence on the quality of the substrate at the optical surface.

In a further embodiment, the substrate is formed from silicon or from germanium. Silicon, in particular, has proved to be particularly advantageous as material for substrates of optical elements which have a high thermal conductivity. The method described further above and also the substrate or optical element produced with the method, however, can also be implemented with other metals or semimetals.

Further features and advantages of the invention are evident from the following description of exemplary embodiments of the invention, with reference to the figures of the drawing, which show details essential to the invention, and from the claims. The individual features may be realized in each case individually by themselves or as a plurality in any desired combination in a variant of the invention.

BRIEF DESCRIPTION OF THE DRAWINGS

Exemplary embodiments are illustrated in the schematic drawing and are explained in the following description. In the figures:

FIGS. 3A-3C show schematic illustrations of three optical elements having substrates which were produced from the material body shown in FIG. 2B, wherein FIG. 3A shows a substrate formed exclusively from the quasi-monocrystalline volume region, FIG. 3B shows a substrate formed from both quasi-monocrystalline and polycrystalline volume regions, and FIG. 3C shows a substrate in which the polycrystalline volume region extends partly below the quasi-monocrystalline volume region.

DETAILED DESCRIPTION

In the following description of the drawings, identical reference signs are used for identical or functionally identical components.

Figure 1A:
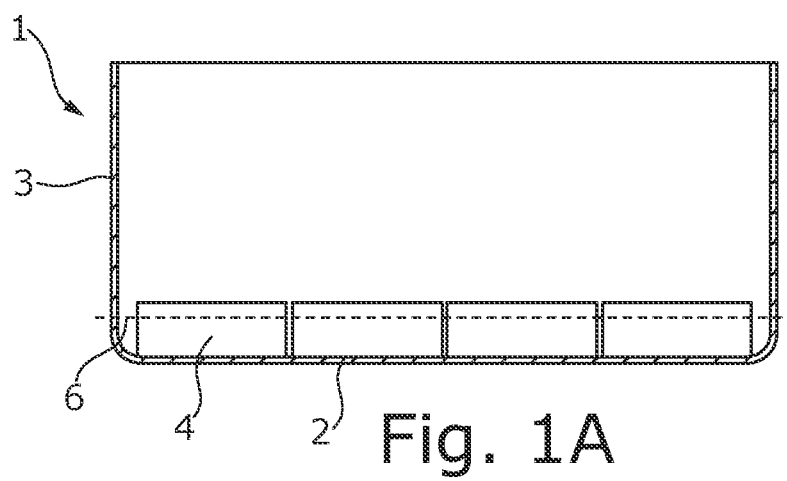
FIGS. 1A and 1B show a schematic illustration of a container with a plurality of seed plates before (FIG. 1A) and after (FIG. 1B) being filled with a starting material in the form of granules.

FIG. 1A shows a container 1 in the form of a large crucible, which, in the example shown, has a base 2 having a square basic area of approximately 130 cm×130 cm, for example. The base 2 is adjoined by four side walls 3 extending in the vertical direction, wherein the side walls are formed integrally with the base 2 in the example shown. The container 1 has a height of approximately 100 cm in the example shown. For the production of a (quasi-) monocrystalline material body made from silicon, the base 2 of the container 1 is covered, in a manner exhibiting substantial surface area coverage, with monocrystalline seed plates 4 composed of silicon, which can have a thickness of approximately 2-5 cm, for example. The monocrystalline seed plates 4 are referred to as seed plates or seed boards because they form the seeds for the later growth of the quasi-monocrystalline daughter material.

Figure 1B:
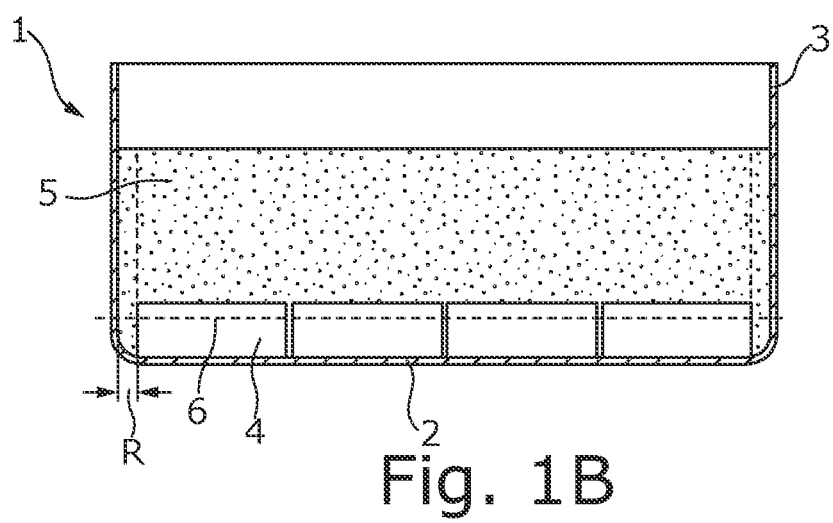

The container 1 is subsequently filled with starting material 5 in the form of polycrystalline silicon granules of varying granulation with the highest possible filling factor, as is shown in FIG. 1B. In a special furnace (not illustrated pictorially), the starting material 5 is melted and a temperature gradient is set in such a way that a melting front 6 extends from above down to a few centimeters into the seed plates 4, as is illustrated in FIG. 1B. Through targeted temperature control, the molten starting material 5 situated above the melting front 6 is subsequently crystallized starting from the seed plates 4 with a solidification front that is as horizontal as possible.

Figure 2A:
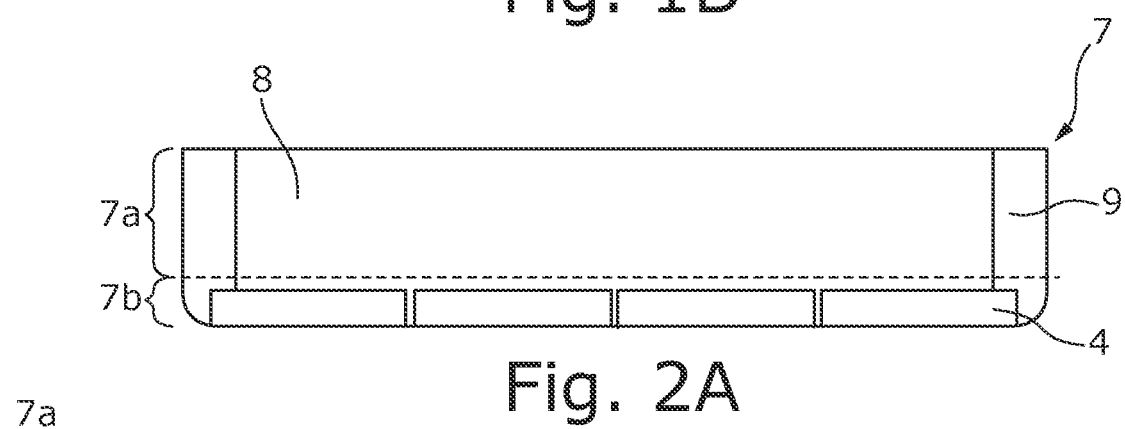
FIGS. 2A-2B show schematic illustrations of a material body having a (quasi-) monocrystalline and a polycrystalline volume region, wherein the material body is shown after melting and directionally solidifying the starting material (FIG. 2A) and after the monocrystalline region with the seed plates removed (FIG. 2B)

After the walls 3 and the base 2 of the container 1 have been removed, a material body 7 shown in FIG. 2A arises, which also contains the partly melted seed plates 4. In general, a volume region 7b having the partly melted seed plates 4 is separated off from the material body 7, specifically along a horizontal cutting line indicated in FIG. 2A. After the separating off, a material body 7a having a (quasi-)monocrystalline volume region 8 and a polycrystalline volume region 9 surrounding the latter in a ring-shaped manner remains, said material body being illustrated in FIG.

2B. In this case, the quasi-monocrystalline volume region 8 of the material body 7a substantially corresponds to a volume region above the seed plates 4 shown in FIG. 1B in which the (quasi-) monocrystalline silicon is formed in the course of solidifying the melt of the starting material 5.

In the region of a wall gap R between the side walls 3 of the container 1 and the side edges of the seed plates 4, the polycrystalline volume region 9 in the form of a seam of polycrystalline silicon is formed around the (quasi-)monocrystalline volume region 8 of the material body 7, 7a. The material body 7a shown in FIG. 2B can have comparatively large dimensions of approximately 130 cm×130 cm×50 cm, for example, wherein the quasi-monocrystalline volume region 8 forms a proportion of generally more than approximately 90% of the total volume of the material body 7a.

Figure 2B:
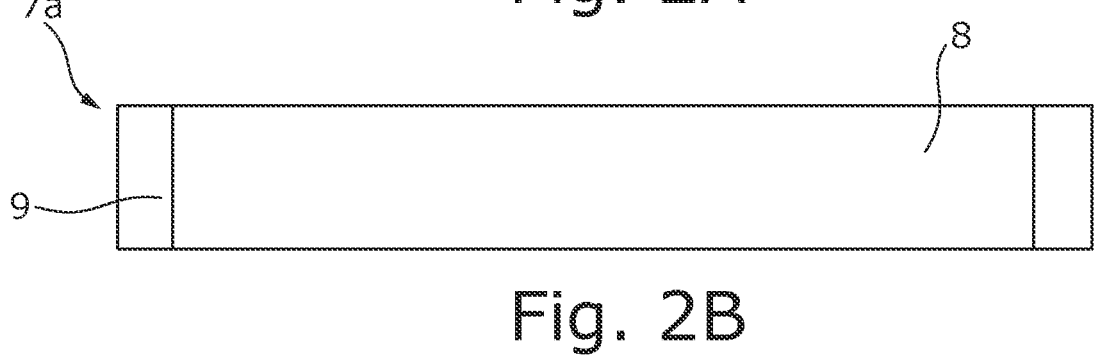
Figure 3A:
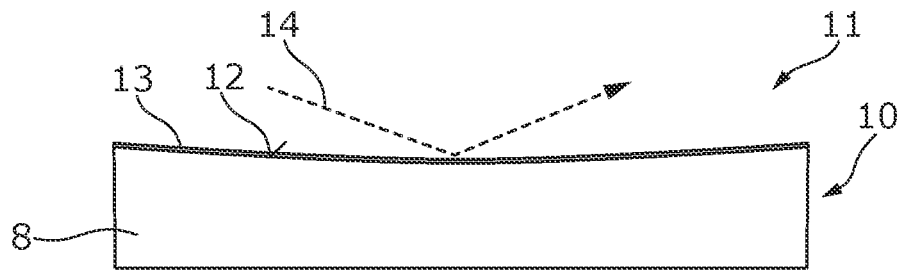
Figure 3B:
Figure 3C:
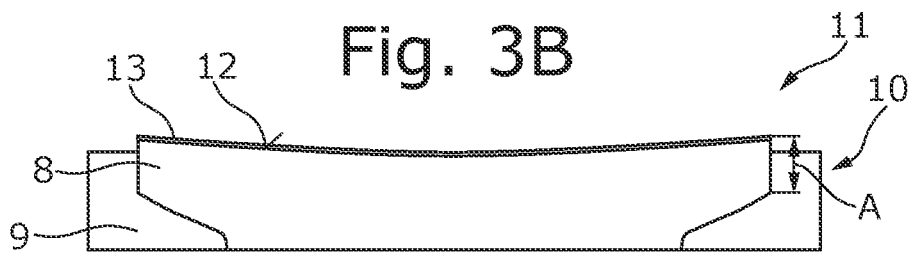

For the production of substrates 10 for (reflective) optical elements 11, such as are illustrated in FIGS. 3A-3C, it is necessary for the material body 7a shown in FIG. 2B to be suitably processed. The processing comprises a mechanical processing that involves bringing the material body 7a to a desired three-dimensional shape. The mechanical processing also involves smoothing and polishing the substrate 10 at an optical surface 12 in order to change the surface constitution thereof, in particular the roughness thereof, and to prepare application of a reflective coating 13. In order to ensure the highest possible surface quality at the optical surface 12, the optical surface 12 is typically formed at that side of the material body 7a which faces the seed plates 4. In the examples shown in FIGS. 3A-3C, the reflective coating 13 is configured to reflect the EUV radiation 14 incident on the reflective coating 13.

In the example shown, the reflective coating 13 comprises alternating individual layers (not illustrated pictorially) composed of a high refractive index material and a low refractive index material, which are molybdenum and silicon in the example shown. The combination of these materials makes it possible to reflect EUV radiation 14 having a wavelength of approximately 13.5 nm. Other material combinations of the individual layers such as e.g. molybdenum and beryllium, ruthenium and beryllium or lanthanum and $B_4C$ are likewise possible. The respective reflective optical element 11 is configured for reflecting EUV radiation 14 incident on the reflective coating 13 with normal incidence, i.e. at comparatively small angles of incidence relative to the surface normal of the optical surface 12. In order to reflect EUV radiation 14 incident on the optical surface 12 with grazing incidence, the reflective coating 13 can be embodied in a different way and comprise for example just a single individual layer or, if appropriate, two or three individual layers.

In the case of the reflective optical element 11 shown in FIG. 3A, the substrate 10 is exclusively formed from the quasi-monocrystalline volume region 8 of the material body 7a. In the case of the example shown in FIG. 3B, the substrate 10 additionally has a polycrystalline volume region 9 surrounding the quasi-monocrystalline volume region 8 in a ring-shaped manner. In the case of the reflective optical element 11 shown in FIG. 3C, the polycrystalline volume region 9 extends partly below the optical surface 12 with the reflective coating 13; to put it more precisely, the polycrystalline volume region 9 extending circumferentially in a ring-shape manner has a radially inwardly projecting partial volume extending below the optical surface 12.

As can likewise be discerned in FIG. 3C, the quasi-monocrystalline volume region 8 extends downwards to a distance A of at least approximately 1 cm from the optical surface 12, i.e. the polycrystalline volume region 9 is spaced apart from the optical surface 12 far enough not to negatively influence the quality of the silicon material at the optical surface 12. The polycrystalline volume region 9 projecting radially outwards beyond the optical surface 12 and shown in FIGS. 3B and 3C can serve for example for linking or for securing the substrate 10 of the reflective optical element 11 for example to a mount or the like.

Figure 4A:
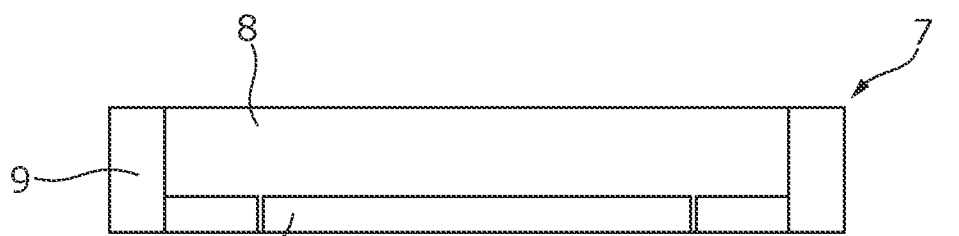
FIGS. 4A-4B show a schematic illustration of a material body having a large seed plate (FIG. 4A), and also a substrate for an optical element that is produced from the material body (FIG. 4B).

FIG. 4A shows a material body 7 which, analogously to the material body 7 shown in FIG. 2A, still comprises the seed plates 4. Unlike in the examples described further above in association with FIGS. 3A-3C, in the example shown in FIG. 4A and in FIG. 4B, the seed plates 4 are not separated from the material body 7 for the production of the substrate 10. Rather, in the case of the substrate 10 shown in FIG. 4B, a central seed plate which was produced by the Czochralski method and accordingly has a large diameter of approximately 30 cm, for example, is mechanically processed in order to form the optical surface 12 at the side of said seed plate facing away from the quasi-monocrystalline volume region 8. In addition to the quasi-monocrystalline volume region 8, the substrate 10 shown in FIG. 4B has a polycrystalline volume region 9 forming a circumferential edge of the substrate 10.

Figure 4B:
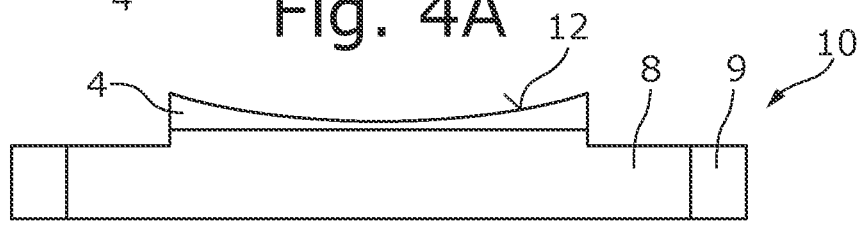

The diameter of the optical surface 12 of the substrate 10 illustrated in FIG. 4B substantially corresponds to the diameter of the seed plate 4 produced using the Czochralski method, but by virtue of the quasi-monocrystalline volume region 8 and additionally by virtue of the polycrystalline volume region 9 the diameter of the (integral) substrate 10 can be increased by comparison with an ingot produced using the Czochralski method. Moreover, by virtue of the quasi-monocrystalline volume region 8, formed below the seed plate 4 forming a monocrystalline volume region, it is possible to increase the thickness of the substrate 10 without the need to use monocrystalline silicon for this purpose, the production of monocrystalline silicon being more complex and thus more expensive than the production of quasi-monocrystalline silicon.

In order to produce an optical element, in the case of the substrate 10 shown in FIG. 4B, a reflective coating is applied on the optical surface 12 of the monocrystalline volume region formed by the seed plate 4, as has been described further above in association with FIGS. 3A-3C. A reflective coating 13 having a high reflectivity for wavelengths other than for wavelengths in the EUV wavelength range can also be applied on the optical surface 10. Applying a reflective coating can be dispensed with, if appropriate, if the substrate 10 is used for producing an optical element operated in transmission, for example.

What is claimed is:

1. Method for producing a reflective optical element, comprising:
   introducing a starting material into a container and melting the starting material,
   producing a material body having a quasi-monocrystalline volume region by directionally solidifying the molten starting material proceeding from a plurality of monocrystalline seed plates arranged in a region of a base of the container,
   producing a substrate by processing the material body to form an optical surface, and
   applying a reflective coating for reflecting extreme ultraviolet (EUV) radiation onto the optical surface for producing the reflective optical element, wherein the optical surface is formed while processing the material body at one of the seed plates at a side of the seed plate facing away from the quasi-monocrystalline volume region.

2. Method according to claim 1, wherein the starting material is a metal or a semimetal.

3. Method according to claim 1, wherein the optical surface is formed using a Czochralski method.

4. Method according to claim 1, wherein the optical surface is formed while processing at the quasi-monocrystalline volume region of the material body.

5. Method according to claim 4, wherein the processing of the material body comprises separating off a volume region containing the seed plates.

6. Method according to claim 1, wherein the substrate is formed both from a quasi-monocrystalline volume region of the material body and from a polycrystalline volume region of the material body.

7. Method according to claim 6, wherein the polycrystalline volume region extends at least partly below the optical surface formed at the quasi-monocrystalline volume region.

8. Method according to claim 6, wherein the polycrystalline volume region forms an edge region of the substrate that projects laterally beyond the quasi-monocrystalline volume region at least at one side of the quasi-monocrystalline volume region.

* * * * *